(12) United States Patent  
Baumgartner et al.

(10) Patent No.: US 7,489,039 B2  
(45) Date of Patent: Feb. 10, 2009

(54) METAL FILL REGION OF A SEMICONDUCTOR CHIP

(75) Inventors: Steven J. Baumgartner, Zumbro Falls, MN (US); Chun-Tao Li, Rochester, MN (US); Salvatore N. Storino, Rochester, MN (US); Mankit Wong, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 11/538,118

(22) Filed: Oct. 3, 2006

(65) Prior Publication Data

US 2008/0079158 A1   Apr. 3, 2008

(51) Int. Cl.  
*H01L 23/48* (2006.01)  
*H01L 23/52* (2006.01)

(52) U.S. Cl. .................. 257/758; 438/622; 438/624

(58) Field of Classification Search ................ 257/750, 257/758, 760, 211; 438/622–624  
See application file for complete search history.

(56) References Cited

U.S. PATENT DOCUMENTS 6,797,999 B2 *   9/2004   Hou et al. ............... 257/211

* cited by examiner

*Primary Examiner*—Theresa T Doan  
(74) *Attorney, Agent, or Firm*—Cantor Colburn LLP

(57) ABSTRACT

Disclosed is a metal fill region of a semiconductor chip including a plurality of layer sets of the semiconductor chip, each set including a first metal fill layer, a second metal fill layer, and an insulation layer included disposed in planes parallel to each other, a plurality of metal fill pieces disposed in each of the metal fill layers, a metal fill piece axis of each of the pieces, wherein each of the axes perpendicularly intersects the planes of said metal fill layers and the insulation layer from any point of reference, and a metal fill pattern configured to position the pieces so that the axis of each piece in the first metal fill layer is linearly displaced of the axis of each piece in the second metal fill layer in at least one direction orthogonal to each of the metal fill axes.

2 Claims, 3 Drawing Sheets

METAL FILL REGION OF A SEMICONDUCTOR CHIP

BACKGROUND OF THE INVENTION

1. Field of the Invention

This invention relates generally to metal fill regions, and more particularly to metal fill regions of a semiconductor chip.

2. Description of Background

In modern semiconductor processes, "fill patterns" are used to ensure a fairly constant terrain and therefore avoid dishing during chemical-mechanical polishing (CMP). For example, if a relatively large region of a circuit contains little or no metal for wiring or power distribution, a layout data program puts metal fill into the region. For digital circuits, the extra capacitance caused by placement of the metal fill in these regions may be acceptable. However, for analog circuits, where every farad of capacitance needs to be accounted for, this is a problem, as too large a capacitance can slow electrical transmission in active wire regions of the circuit. Thus, a metal fill strategy that minimizes dishing while also maintaining capacitance at acceptable levels is desirable.

SUMMARY OF THE INVENTION

Disclosed is a metal fill region of a semiconductor chip including a plurality of layer sets of the semiconductor chip, a first metal fill layer and a second metal fill layer included in each of the plurality of layer sets, an insulation layer included in each of the plurality of layer sets, the insulation layer disposed between the first metal fill layer and the second metal fill layer, wherein the first metal fill layer, the second metal fill layer, and the insulation layer are disposed in planes parallel to each other, a plurality of metal fill pieces disposed in each of the first metal wire layer and the second metal wire layer, a metal fill piece axis of each of the plurality of metal fill pieces disposed in the first metal fill layer and the second metal fill layer, wherein each of the metal fill piece axes perpendicularly intersect the planes of said first metal fill layer, the second metal fill layer, and the insulation layer from any point of reference, and a metal fill pattern configured to position the metal fill pieces so that the metal fill piece axes of each of the metal fill pieces in the first metal fill layer are linearly displaced of the metal fill piece axes of each of the metal fill pieces in the second metal fill layer in at least one direction orthogonal to each of the metal fill axes.

Also disclosed is a metal fill region of a semiconductor chip including a plurality of layer sets of the semiconductor chip, two metal fill layers included in the plurality of layer sets, the two metal fill layers including a first metal fill layer and a second metal fill layer, two insulation layers included in the plurality of layer sets, the two insulation layers including a first insulation layer and a second insulation, wherein the two insulation layers are alternatingly disposed with the two metal fill layers to preclude adjacency between the first metal fill layer and the second metal fill layer, and to preclude adjacency between the first insulation layer and the second insulation layer, and wherein the first metal fill layer, the second metal fill layer, the first insulation layer and the second insulation layer are disposed in planes parallel to each other, a plurality of metal fill pieces disposed in each of the first metal wire layer and the second metal wire layer, a metal fill piece axis of each of the plurality of metal fill pieces disposed in the first metal fill layer and the second metal fill layer, wherein each of the metal fill piece axes perpendicularly intersect the planes of the first metal fill layer, the second metal fill layer, the first insulation layer, and the second insulation layer from any point of reference, a metal fill pattern configured to position the metal fill pieces so that the metal fill piece axes of each of the metal fill pieces in the first metal fill layer are linearly displaced of the metal fill piece axes of each of the metal fill pieces in the second metal fill layer in at least one direction orthogonal to each of the metal fill axes, a plurality of metal interconnector fill pieces disposed in each of the first insulation layer and the second insulation layer, a metal interconnector axis of each of the plurality of metal interconnector fill pieces disposed in the first insulation layer and the second insulation layer, wherein each of the metal interconnector axes perpendicularly intersect the planes of the first metal fill layer, the second metal fill layer, the first insulation layer, and the second insulation from any point of reference, and a metal interconnector fill pattern configured to position the metal interconnector fill pieces so that the metal interconnector axes of each of the metal interconnector fill pieces in the first insulation layer are linearly displaced of the metal interconnector axes of each of the metal interconnector fill pieces in the second insulation layer in at least one direction orthogonal to each of the metal interconnector axes.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Metal fill regions of circuits are areas of the circuit that contain little or no metal for wiring or power distribution. These regions must come close to matching the density of actively wired regions of the circuit to limit dishing during CMP, and thus metal fill is disposed within these regions. A strategy for disposing metal fill in these regions is discussed hereinbelow.

Figure 1:
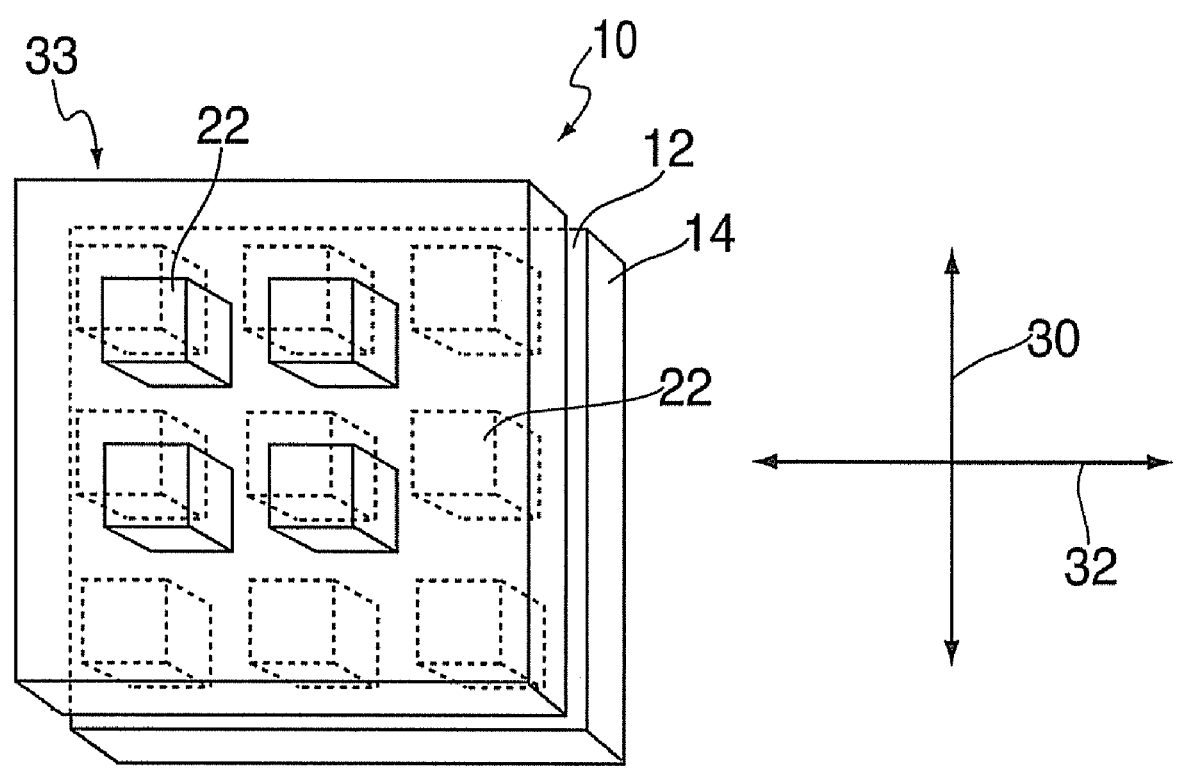
FIG. 1 is a schematic top perspective view of a metal fill region of a semiconductor chip.
Figure 2:
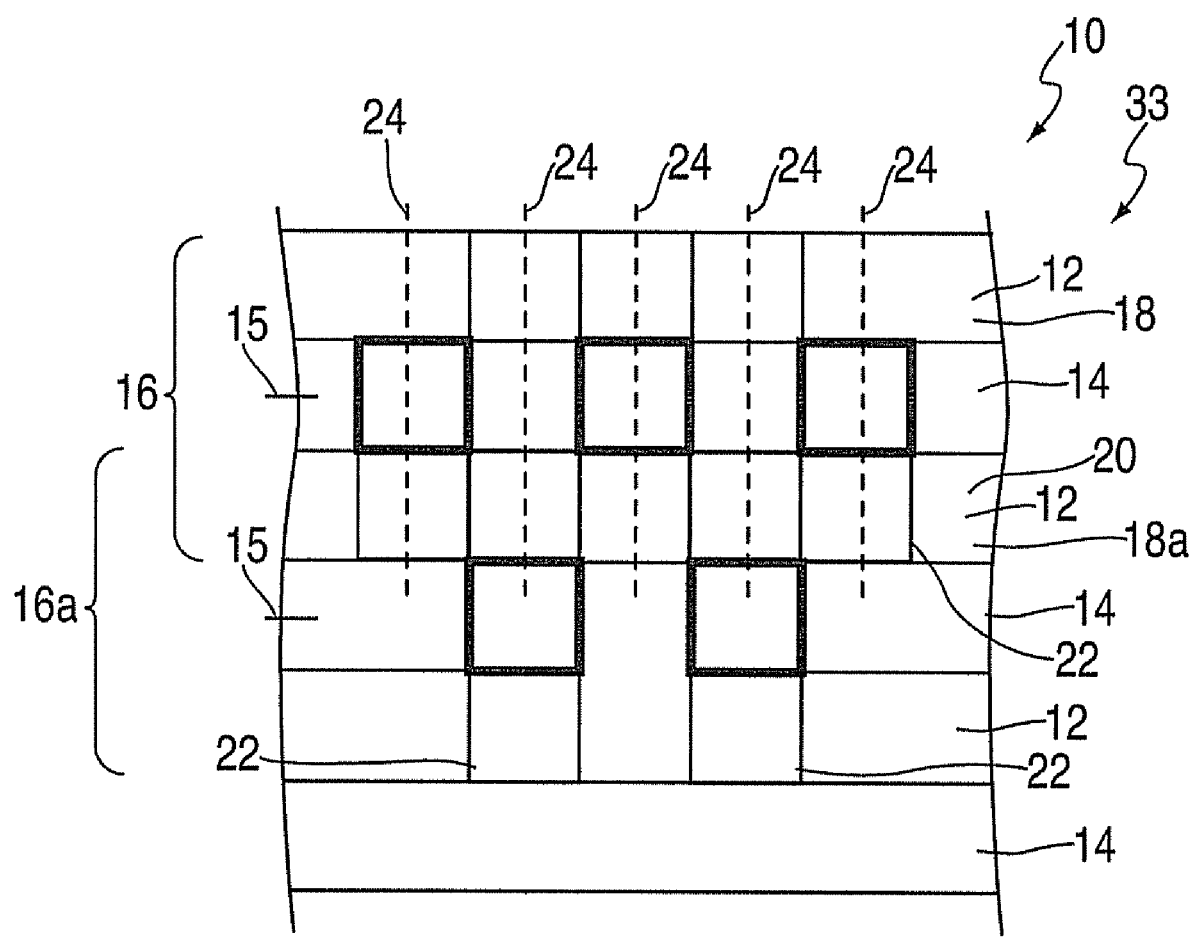
FIG. 2 is a schematic cross-section view of a metal fill region of a semiconductor chip.

Referring to FIGS. 1 and 2, a metal fill region 10 of a semiconductor chip is illustrated. The region 10 includes a plurality of metal fill layers 12 and insulation layers 14 disposed in planes 15 parallel to each other. The insulation layers 14 are disposed between the metal fill layers 12. Any insulation layer 14 may be grouped with any two metal fill layers 12 it is disposed between, with this group comprising a layer set 16. There may be a plurality of layer sets 16 and 16a included in the region 10.

As is illustrated in FIG. 2, the layer set 16 includes a first metal fill layer 18 and a second metal fill layer 20 (both of which being metal fill layers 12), with one of the insulation layers 14 of the region 10 being disposed between the first and second metal fill layers 18 and 20. Along with the layer set 16, FIG. 2 also illustrates the second layer set 16a. It should be appreciated that the second metal fill layer 20 of layer set 16, also functions as a first metal fill layer 18a of second layer set 16a. Thus layer sets 16 and 16a can "share" the metal fill layer 20/18a, as can any other non-illustrated layer sets that overlap in this manner.

For simplicity purposes, the metal fill layers 12 and insulation layer 14 will now be discussed in relation to the layer set 16 only (not 16a). Referring back to FIGS. 1 and 2, each metal fill layer 12 includes a plurality of metal fill pieces 22. Each metal fill piece 22 of both the first metal fill layer 18 and second metal fill layer 20 includes a metal fill piece axis 24 (the axis 24 of the figures is not a tangible element, but a representation of axis position). Each axis 24 perpendicularly intersects the planes 15 of the first metal fill layer 18, second metal fill layer 20, and insulation layer 14 from any point of reference. The metal fill pieces 22 are positioned so that the axis 24 of each piece 22 in the first metal fill layer 18 is linearly displaced of the axis 24 of each piece 22 in the second metal fill layer 20. The linear displacement occurs in at least one direction orthogonal to the axes 24, such as directions 30 and 32. This displacement creates a metal fill pattern 33 in the metal fill layers 12 that off-sets the metal fill pieces 22 of the metal fill layers nearest to each other, with this off-setting occurring throughout all the metal fill layers 12 of the region 10. Offsetting the pieces 22 in this manner reduces capacitance within the metal fill region 10, while allowing the region 10 to still contain enough metal fill pieces 22 to provide the density requirements of the semiconductor chip.

Figure 3:
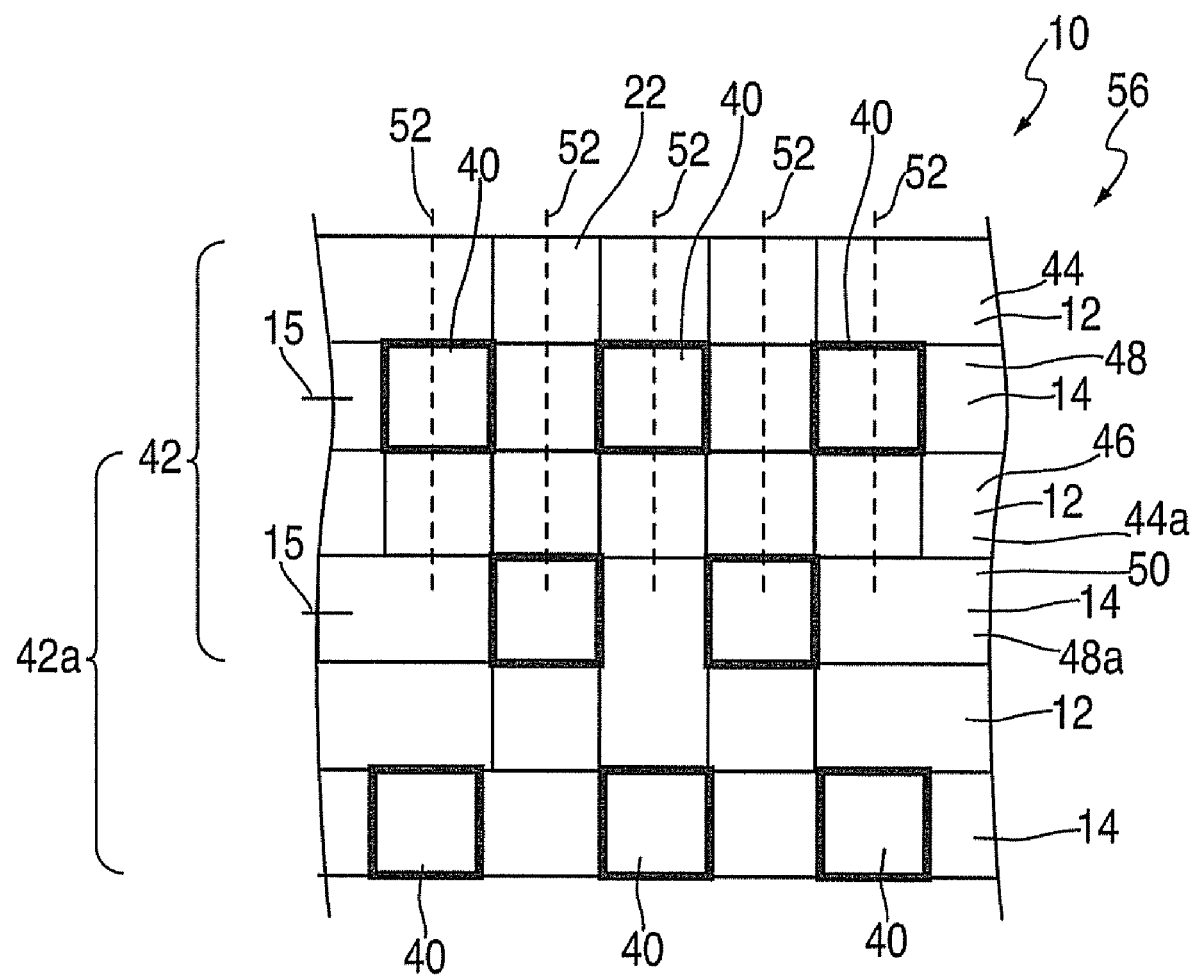
FIG. 3 is a schematic cross-section view of a metal fill region of a semiconductor chip, showing layer sets that include multiple insulation layers.

As is shown best in FIG. 3, the insulation layers 14 also include metal fill in the form of plurality of metal interconnector fill pieces 40. These interconnector pieces 40, which are also known as via, traverse the insulation layers 14 of the circuit, and connect (in active circuits) routing wire and I/O wire in the metal wire containing layers (again of an active circuit). In the metal fill region 10 of the circuit, there is no need to connect the metal fill of one metal fill layer 12 with the metal fill of another metal fill layer 12, as there is no active electrical transmission running through the metal region 10. However, there may be a desire to match density of the insulation layers 14 of the metal fill region 10 of the circuit with the density of insulation layers in active regions of the circuit, and thus, the metal interconnector fill pieces 40 may be added to the insulation layer 14 of the metal fill region 10. By matching insulation layer density along with metal wire/fill layer density, dishing can be further diminished. Like the metal fill layers 20 though, it is also desirable to offset the interconnector pieces 40 of the insulation layers 14 nearest to each other, so as to maintain a reduced capacitance.

Referring to FIG. 3, the interconnector pieces 40 are offset similarly to the metal fill pieces 22 of FIGS. 1 and 2. In FIG. 3, a layer set 42 includes a first metal fill layer 44, a second metal fill layer 46 (both of which being metal fill layers 12), a first insulation layer 48 and a second insulation layer 50, wherein the two metal fill layers 44 and 46 are alternatingly disposed with the two insulation layers 48 and 50 to preclude adjacency between the first metal fill layer and the second metal fill layer, and to preclude adjacency between the first insulation layer and the second insulation layer. Along with the layer set 42, FIG. 3 also illustrates a second layer set 42a. It should be appreciated that the second metal fill layer 46 and second insulation layer 50 of layer set 42, also function as a first metal fill layer 44a and first insulation layer 48a of the second layer set 42a. Thus layer sets 42 and 42a can "share" the metal fill layer 46/44a and insulation layer 50/48a, as can any other non-illustrated layer sets that overlap in this manner.

For simplicity purposes, the metal fill layers 12 and insulation layers 14 will now be discussed in relation to the layer set 42 only (not 42a), and since off-setting of the metal fill pieces 22 has already been discussed above, only the interconnector pieces 40 will be discussed hereinbelow. Referring back to FIG. 3, each interconnector piece 40 of both the first insulation layer 48 and second insulation layer 50 includes a metal interconnector axis 52. Each axis 52 perpendicularly intersects the parallel planes 15 of the first metal fill layer 44, second metal fill layer 46, first insulation layer 48, and second insulation layer 50. The interconnector pieces 40 are positioned so that the axis 52 of each interconnector piece 40 in the first insulation layer 48 is linearly displaced of the axis 52 of each interconnector piece 40 in the second insulation layer 50. The linear displacement occurs in at least one direction orthogonal to the axes 52, such as directions 30 and 32 (as shown in FIG. 1). This displacement creates a metal interconnector pattern 56 in the insulation layers 14 that offsets the interconnector pieces 40 of the insulation layers 14 nearest to each other, with this offsetting occurring throughout all the insulation layers 14 of the region 10. Off-setting the interconnector pieces 40 in this manner reduces capacitance within the metal fill region 10, while allowing the region 10 to still contain enough metal fill pieces 22 and interconnector pieces 40 to provide the density requirements of the semiconductor chip.

While the invention has been described with reference to an exemplary embodiment, it should be understood by those skilled in the art that various changes may be made and equivalents may be substituted for elements thereof without departing from the scope of the invention. In addition, many modifications may be made to adapt a particular situation or substance to the teachings of the invention without departing from the scope thereof. Therefore, it is important that the invention not be limited to the particular embodiment disclosed as the best mode contemplated for carrying out this invention, but that the invention will include all embodiments falling within the scope of the apportioned claims. Moreover, unless specifically stated any use of the terms first, second, etc. do not denote any order or importance, but rather the terms first, second, etc. are used to distinguish one element from another.

What is claimed is:

1. A metal fill region of a semiconductor chip comprising:
   a plurality of layer sets of the semiconductor chip;
   a first metal fill layer and a second metal fill layer included in each of said plurality of layer sets;
   an insulation layer included in each of said plurality of layer sets, said insulation layer disposed between said first metal fill layer and said second metal fill layer, wherein said first metal fill layer, said second metal fill layer, and said insulation layer are disposed in planes parallel to each other;
   a plurality of metal fill pieces disposed in each of said first metal fill layer and said second metal fill layer;
   a metal fill piece axis of each of said plurality of metal fill pieces disposed in said first metal fill layer and said second metal fill layer, wherein each of said metal fill piece axes perpendicularly intersect said planes of said first metal fill layer, said second metal fill layer, and said insulation layer from any point of reference; and
   a metal fill pattern configured to position said metal fill pieces so that said metal fill piece axes of each of said metal fill pieces in said first metal fill layer are linearly displaced of said metal fill piece axes of each of said metal fill pieces in said second metal fill layer in at least one direction orthogonal to each of said metal fill axes.

2. A metal fill region of a semiconductor chip comprising:
   a plurality of layer sets of the semiconductor chip;
   two metal fill layers included in said plurality of layer sets, said two metal fill layers including a first metal fill layer and a second metal fill layer;

two insulation layers included in said plurality of layer sets, said two insulation layers including a first insulation layer and a second insulation, wherein said two insulation layers are alternatingly disposed with said two metal fill layers to preclude adjacency between said first metal fill layer and said second metal fill layer, and to preclude adjacency between said first insulation layer and said second insulation layer, and wherein said first metal fill layer, said second metal fill layer, said first insulation layer and said second insulation layer are disposed in planes parallel to each other;

a plurality of metal fill pieces disposed in each of said first metal fill layer and said second metal fill layer;

a metal fill piece axis of each of said plurality of metal fill pieces disposed in said first metal fill layer and said second metal fill layer, wherein each of said metal fill piece axes perpendicularly intersect said planes of said first metal fill layer, said second metal fill layer, said first insulation layer, and said second insulation layer from any point of reference;

a metal fill pattern configured to position said metal fill pieces so that said metal fill piece axes of each of said metal fill pieces in said first metal fill layer are linearly displaced of said metal fill piece axes of each of said metal fill pieces in said second metal fill layer in at least one direction orthogonal to each of said metal fill axes;

a plurality of metal interconnector fill pieces disposed in each of said first insulation layer and said second insulation layer;

a metal interconnector axis of each of said plurality of metal interconnector fill pieces disposed in said first insulation layer and said second insulation layer, wherein each of said metal interconnector axes perpendicularly intersect said planes of said first metal fill layer, said second metal fill layer, said first insulation layer, and said second insulation from any point of reference; and a metal interconnector fill pattern configured to position said metal interconnector fill pieces so that said metal interconnector axes of each of said metal interconnector fill pieces in said first insulation layer are linearly displaced of said metal interconnector axes of each of said metal interconnector fill pieces in said second insulation layer in at least one direction orthogonal to each of said metal interconnector axes.

\* \* \* \* \*